(12) United States Patent
Nam et al.

(10) Patent No.: US 7,847,713 B2
(45) Date of Patent: Dec. 7, 2010

(54) ALGORITHMIC ANALOG-TO-DIGITAL CONVERTER

(75) Inventors: Jae Won Nam, Pohang-si (KR); Young Deuk Jeon, Daejeon (KR); Young Kyun Cho, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 28 days.

(21) Appl. No.: 12/433,780

(22) Filed: Apr. 30, 2009

(65) Prior Publication Data

US 2010/0085229 A1 Apr. 8, 2010

(30) Foreign Application Priority Data

Oct. 6, 2008 (KR) ...................... 10-2008-0097842

(51) Int. Cl.
*H03M 1/10* (2006.01)
(52) U.S. Cl. .................................... 341/120
(58) Field of Classification Search .......... 341/118, 341/120, 155, 161, 162
See application file for complete search history.

(56) References Cited

U.S. PATENT DOCUMENTS

| 6,295,016 B1 * | 9/2001 | Chiang | 341/161 |
|---|---|---|---|
| 6,323,800 B1 * | 11/2001 | Chiang | 341/161 |
| 6,396,429 B2 * | 5/2002 | Singer et al. | 341/155 |
| 6,486,820 B1 * | 11/2002 | Allworth et al. | 341/161 |
| 6,825,783 B2 * | 11/2004 | You | 341/118 |
| 6,882,294 B2 * | 4/2005 | Linder et al. | 341/154 |
| 7,119,729 B2 | 10/2006 | Wada et al. | |
| 7,187,310 B2 * | 3/2007 | El-Sankary et al. | 341/120 |
| 7,187,318 B1 * | 3/2007 | Lee et al. | 341/161 |
| 7,405,681 B2 * | 7/2008 | Jonsson et al. | 341/120 |
| 7,612,700 B2 * | 11/2009 | Kawahito et al. | 341/161 |
| 7,612,703 B2 * | 11/2009 | Chen et al. | 341/172 |
| 2006/0139199 A1 | 6/2006 | Casper et al. | |
| 2008/0074304 A1 * | 3/2008 | Horie | 341/155 |
| 2008/0129570 A1 | 6/2008 | Lim et al. | |
| 2010/0039302 A1 * | 2/2010 | Ali et al. | 341/120 |

FOREIGN PATENT DOCUMENTS

| JP | 2005-136540 | 5/2005 |
|---|---|---|
| JP | 2005-252940 | 9/2005 |
| KR | 1020000033912 A | 6/2000 |
| KR | 1020040033031 A | 4/2004 |
| KR | 1020040095676 A | 11/2004 |
| KR | 1020060052937 A | 5/2006 |
| KR | 1020070109856 A | 11/2007 |
| KR | 1020080040484 A | 5/2008 |
| KR | 1020080051676 A | 6/2008 |

OTHER PUBLICATIONS

Young-Jae Cho et at., "A 10b 25MS/s 4.8mW 0.13um CMOS ADC for Digital Multimedia Broadcasting Applications," IEEE 2006 Custom Intergrated Circuits Conference, 2006, pp. 497-500.

\* cited by examiner

*Primary Examiner*—Linh V Nguyen

(57) ABSTRACT

Provided is an algorithmic analog-to-digital converter (ADC). In the algorithmic ADC, the number of preprocessing amplifiers used in a flash ADC is reduced by sharing the preprocessing amplifiers in the flash ADC, and thus chip size can be reduced. In addition, power consumption can be reduced by dynamically decreasing the bandwidth of an operational amplifier included in a multiplying digital-to-analog converter (MDAC) according to a required resolution.

9 Claims, 6 Drawing Sheets

FIG. 2
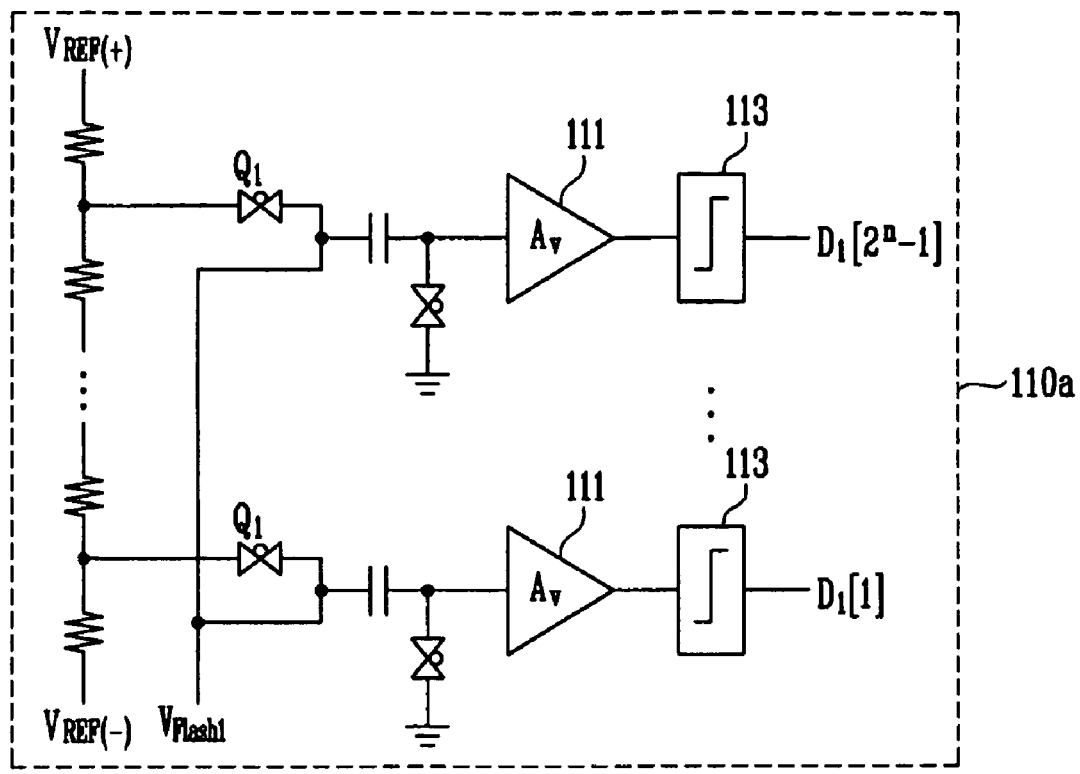
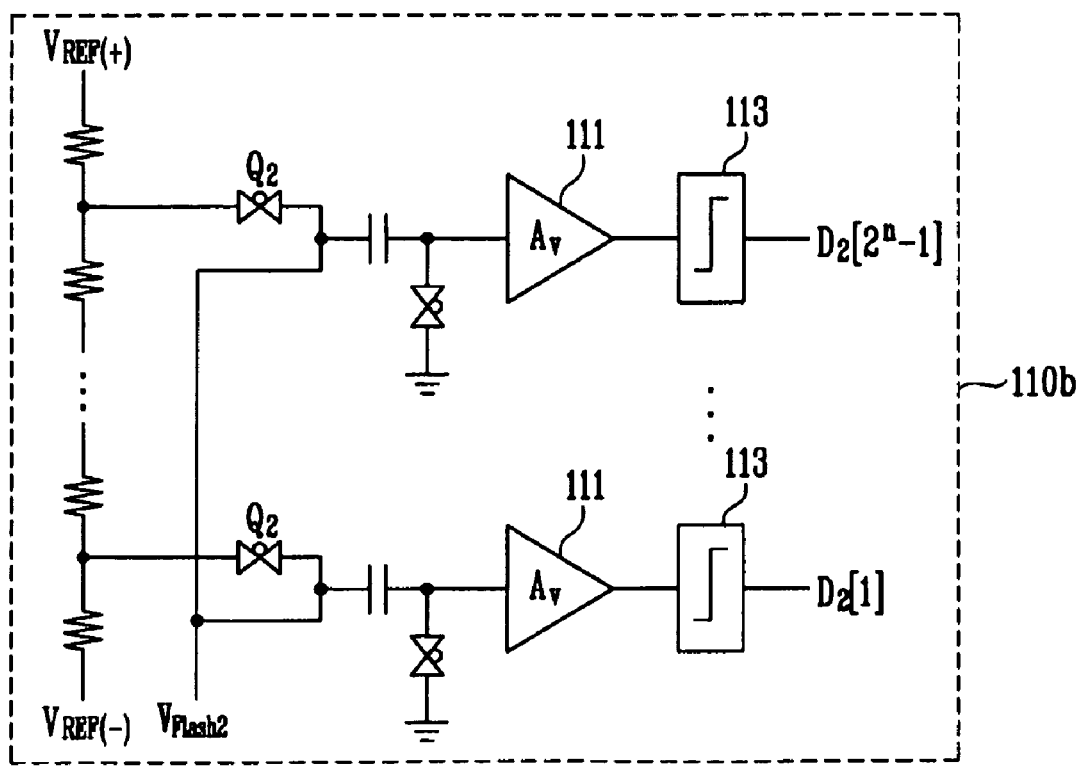

FIG. 6
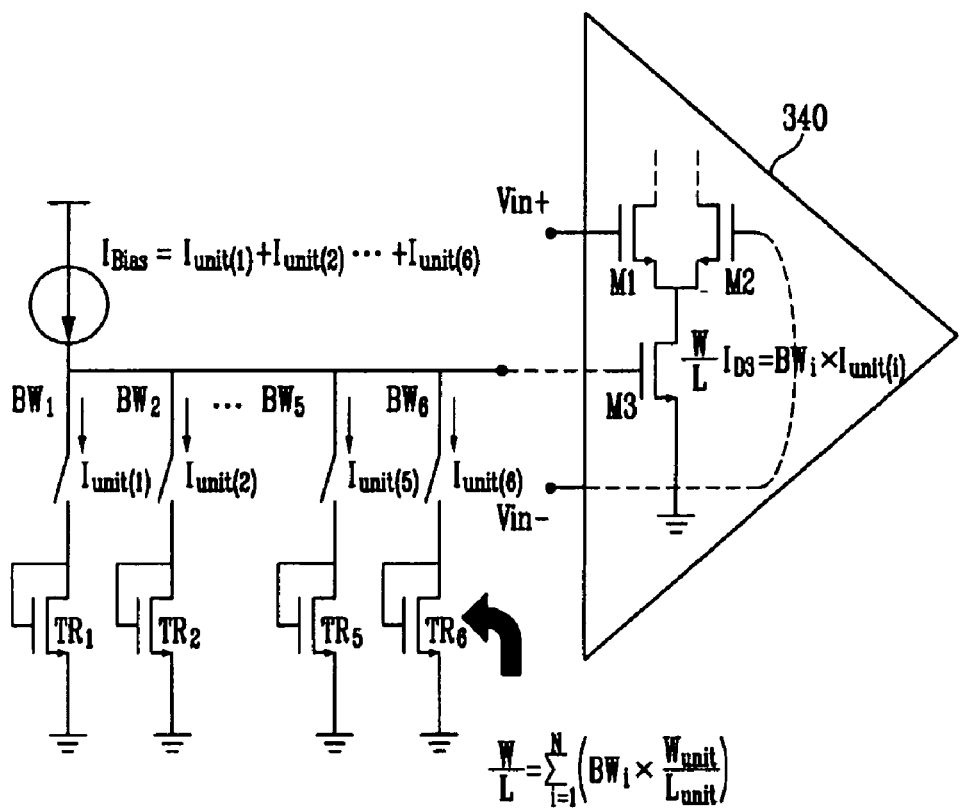
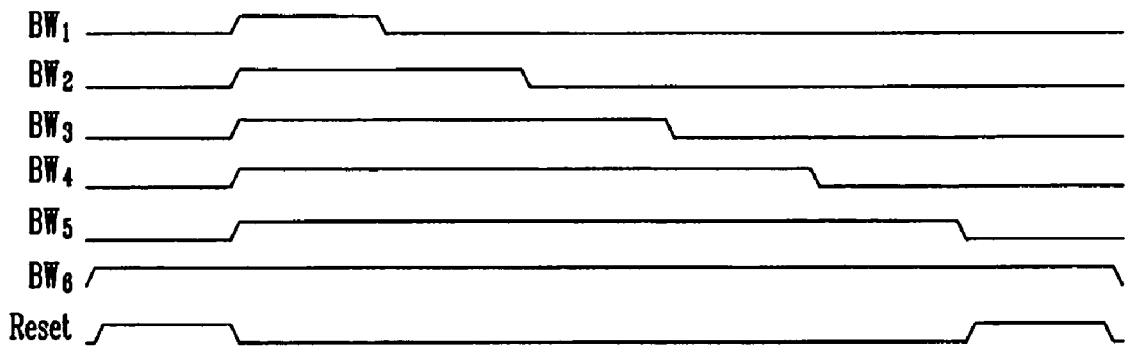

ALGORITHMIC ANALOG-TO-DIGITAL CONVERTER

CROSS-REFERENCE TO RELATED APPLICATION

This application claims priority to and the benefit of Korean Patent Application No. 10-2008-0097842, filed Oct. 6, 2008, the disclosure of which is incorporated herein by reference in its entirety.

BACKGROUND

1. Field of the Invention

The present invention relates to an algorithmic analog-to-digital converter (ADC), and more particularly, to an algorithmic ADC having a reduced chip size and improved power efficiency.

2. Discussion of Related Art

Mobile communication terminals convert a received analog signal into a digital signal that is insusceptible to noise, and this conversion process is performed by an ADC. In particular, mobile communication terminals require high portability and thus need a small and low-power ADC.

Among already-known various ADCs, an algorithmic ADC is widely used to optimize a chip size and power consumption.

FIG. 1 is a circuit diagram of a conventional algorithmic ADC, and FIG. 2 shows circuit diagrams of first and second flash ADCs shown in FIG. 1.

As illustrated in FIG. 1, a conventional algorithmic ADC 100 includes first and second flash ADCs 110a and 110b, a multiplying digital-to-analog converter (MDAC) 150, and a digital correction circuit 170.

Each of the first and second flash ADCs 110a and 110b receives an analog signal, converts it into a digital signal, and outputs the digital signal. As illustrated in FIG. 2, the first and second flash ADCs 110a and 110b each include a plurality of preprocessing amplifiers 111 and a plurality of latches 113.

The MDAC 150 includes first and second DACs 120a and 120b, a subtractor 130, and an operational amplifier 140. Residual voltage left after digitization by the first and second flash ADCs 110a and 110b is again converted into an analog signal and output.

The digital correction circuit 170 corrects errors of the digital signals output from the first and second flash ADCs 110a and 110b. When the first and second flash ADCs 110a and 110b have n-bit resolution in the conventional algorithmic ADC 100, $2^n-1$ number of the preprocessing amplifiers 111 are used in the first and second flash ADCs 110a and 110b. Here, when the first and second flash ADCs 110a and 110b have a resolution of 4 bits or more, chip size significantly increases due to the preprocessing amplifiers 111.

Even if the first and second flash ADCs 110a and 110b have, for example, 3-bit resolution, 7 of the preprocessing amplifiers 111 are used in each of the first and second flash ADCs 110a and 110b. In total, 14 of the preprocessing amplifiers 111 are used, and thus chip size increases.

In addition, in the conventional algorithmic ADC 100, the MDAC 150 performs digital-to-analog signal conversion in each conversion step according to a clock signal CK having a specific period. Thus, the period of the signal conversion operation is fixed, and more current than necessary is consumed in a step of outputting low bits.

SUMMARY OF THE INVENTION

The present invention is directed to reducing the number of preprocessing amplifiers used in a flash analog-to-digital converter (ADC) of an algorithmic ADC and reducing chip size by sharing the preprocessing amplifiers in the flash ADC.

The present invention is also directed to reducing power consumption by dynamically adjusting the bandwidth of an operational amplifier included in a multiplying digital-to-analog converter (MDAC) according to a resolution required for an algorithmic ADC.

One aspect of the present invention provides an algorithmic ADC comprising: a flash ADC having shared preprocessing amplifiers, converting an analog input signal into a digital signal and outputting the digital signal; an MDAC including first and second DACs, a subtractor, and an operational amplifier, the MDAC converting residual voltage left after digitization by the flash ADC back into an analog signal and outputting the analog signal; and a bandwidth adjustment signal generator for generating bandwidth adjustment signals according to a required resolution and outputting the bandwidth adjustment signals to the operational amplifier of the MDAC. Here, bias current of the operational amplifier is adjusted according to the bandwidth adjustment signals, and thus a bandwidth of the operational amplifier dynamically varies.

When the flash ADC is an n-bit flash ADC, $2^n-1$ number of the preprocessing amplifiers may be included in the n-bit flash ADC, and an operating speed of the preprocessing amplifiers included in the flash ADC may be double a reference speed.

The operational amplifier may include: first and second transistors for amplifying and outputting the residual voltage left after digitization by the flash ADC; and a third transistor for supplying the bias current to the first and second transistors. Here, a plurality of bleeding transistors for adjusting the bias current supplied to the first and second transistors according to the bandwidth adjustment signals may be connected to a gate electrode of the third transistor.

The bandwidth adjustment signals applied to the bleeding transistors may have different duty cycles, and thus currents corresponding to the bandwidth adjustment signals may flow through the bleeding transistors.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIG. 2 shows circuit diagrams of first and second flash ADCs shown in FIG. 1;

FIG. 6 is a diagram illustrating a dynamic bandwidth adjustment function of an operational amplifier according to an exemplary embodiment of the present invention.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention.

Figure 1:
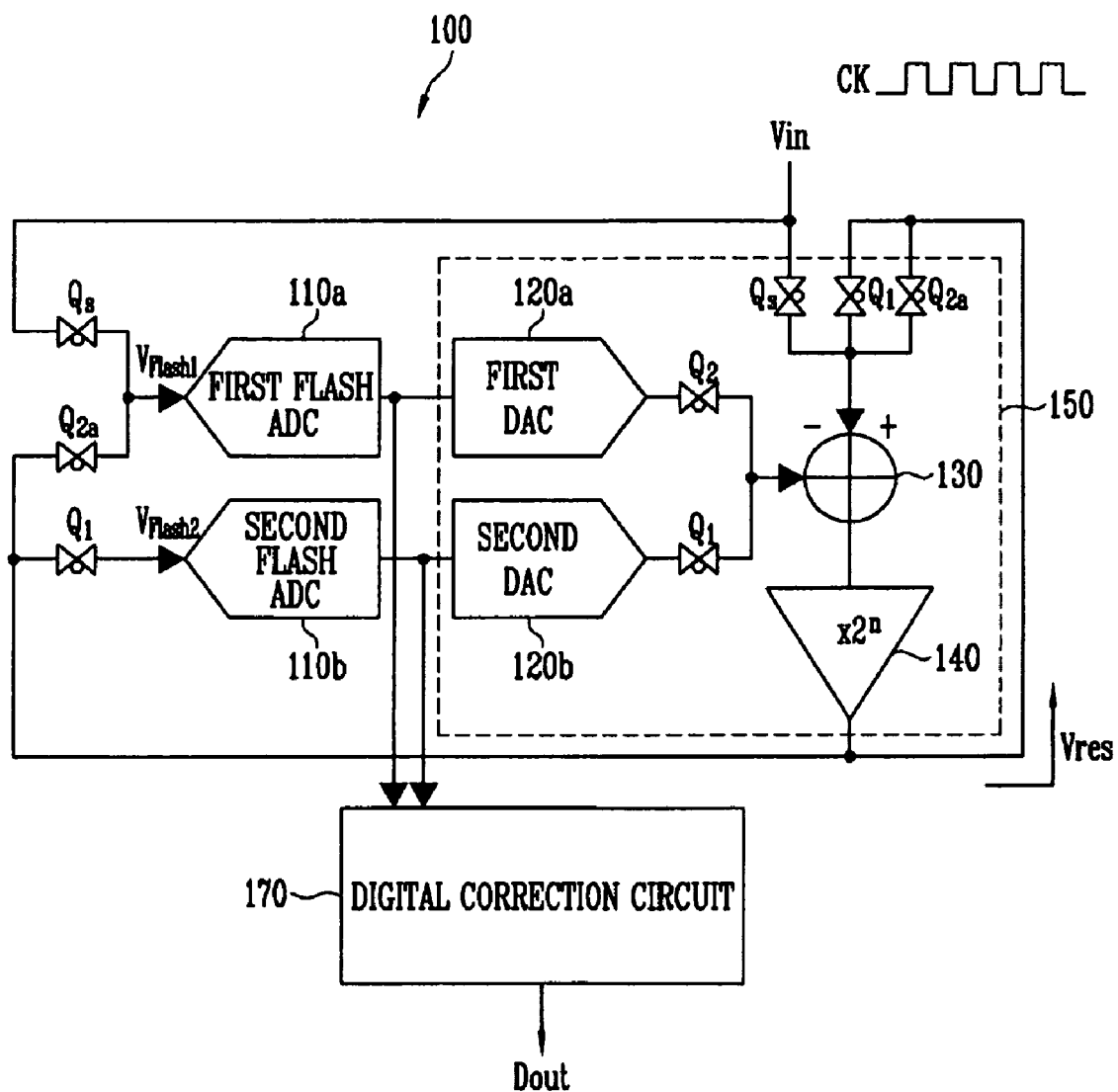
FIG. 1 is a circuit diagram of a conventional algorithmic analog-to-digital converter (ADC)
Figure 3:
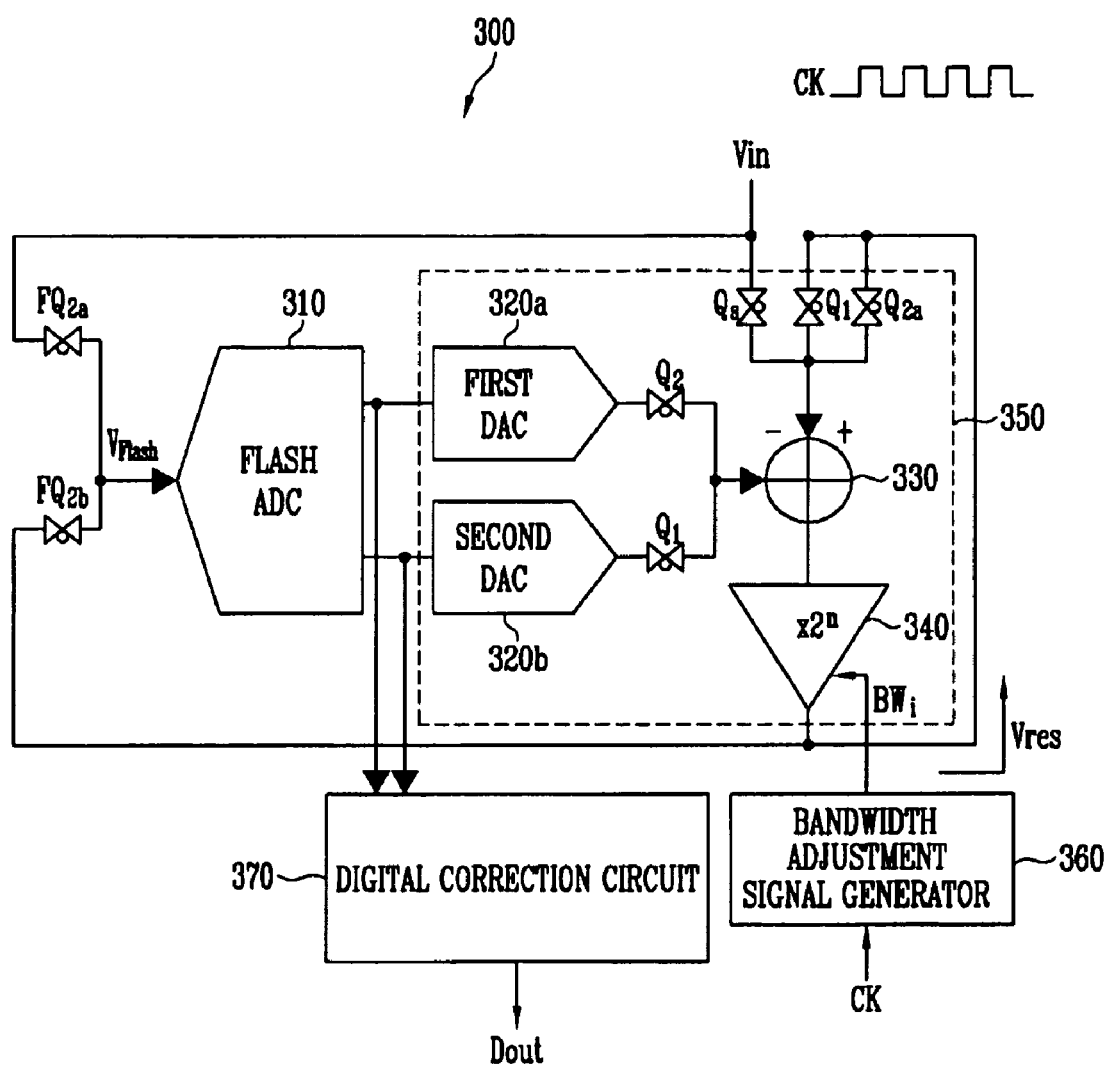
FIG. 3 is a circuit diagram of an algorithmic ADC according to an exemplary embodiment of the present invention.

FIG. 3 is a circuit diagram of an algorithmic analog-to-digital converter (ADC) according to an exemplary embodiment of the present invention.

As illustrated in FIG. 3, an algorithmic ADC 300 according to an exemplary embodiment of the present invention includes a flash ADC 310, a multiplying digital-to-analog converter (MDAC) 350, a bandwidth adjustment signal generator 360, and a digital correction circuit 370. The flash ADC 310 converts an analog input signal into a digital signal and outputs the digital signal. The MDAC 350 converts residual voltage left after digitization by the flash ADC 310 back into an analog signal and outputs the analog signal. The bandwidth adjustment signal generator 360 generates a bandwidth adjustment signal $BW_i$ according to a required resolution and outputs it to the MDAC 350. The digital correction circuit 370 corrects errors in the digital signal output from the flash ADC 310. Here, the MDAC 350 includes first and second DACs 320a and 320b, a subtractor 330, and an operational amplifier 340.

The algorithmic ADC 300 has notable features in that (1) the number of preprocessing amplifiers is cut in half due to a preprocessing-amplifier-sharing structure to reduce chip size, and (2) power consumption can be reduced by dynamically adjusting the bandwidth of the operational amplifier 340 included in the MDAC 350 according to a required resolution. The constitution and operation of the algorithmic ADC 300 will be described in detail below.

(1) The Preprocessing-Amplifier-Sharing Structure of the Flash ADC 310

Figure 4:
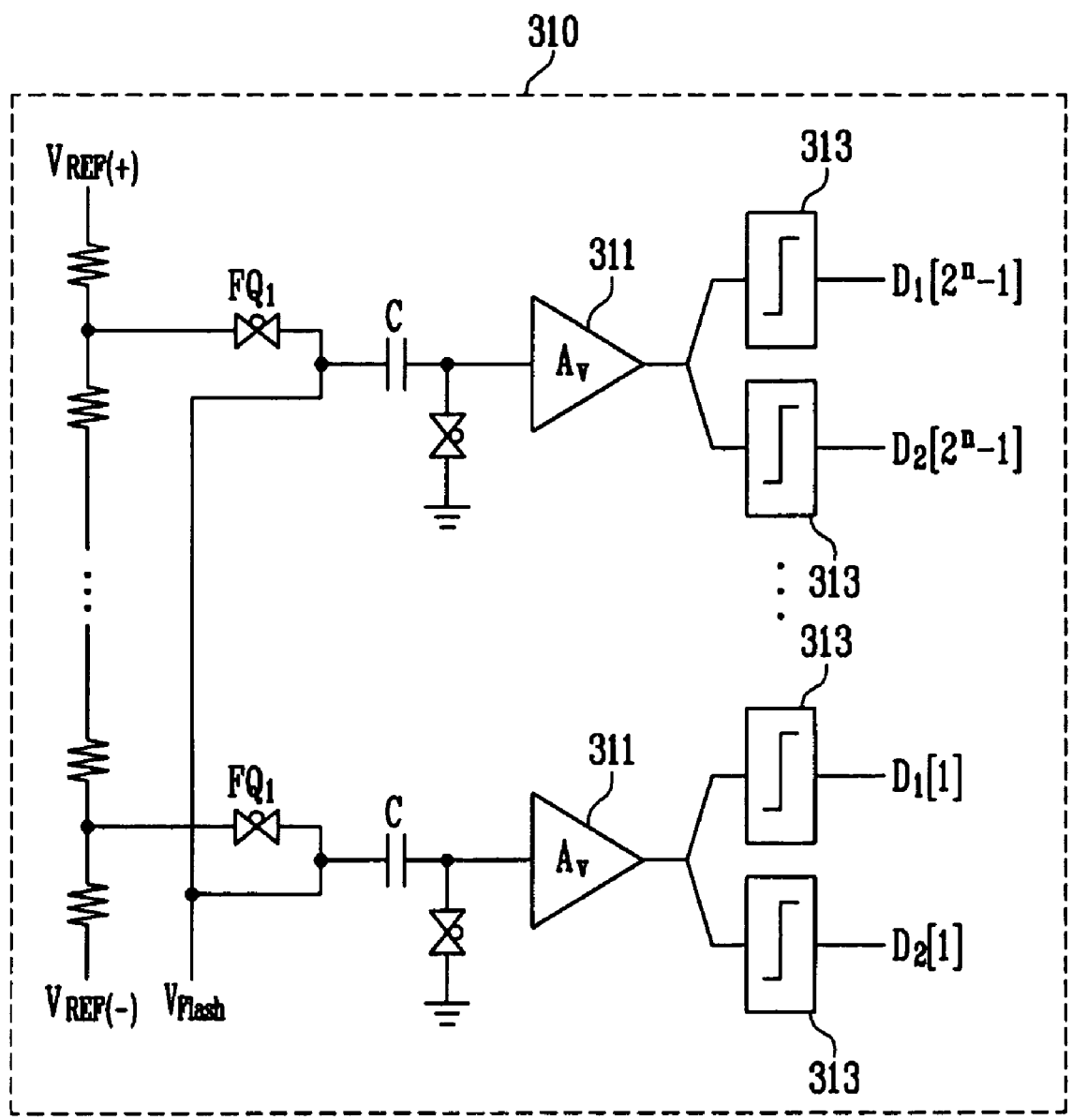
FIG. 4 is a circuit diagram of a 2-bit flash ADC as an example of a flash ADC according to an exemplary embodiment of the present invention.

FIG. 4 is a circuit diagram of a 2-bit flash ADC as an example of the flash ADC 310 according to an exemplary embodiment of the present invention.

As illustrated in FIG. 4, the 2-bit flash ADC 310 according to an exemplary embodiment of the present invention includes two preprocessing amplifiers 311 and four latches 313. The 2-bit flash ADC 310 converts an analog input signal into a digital signal and outputs the digital signal.

In the conventional 2-bit flash ADCs 110a and 110b, two preprocessing amplifiers are included in each of flash ADC 110a and 110b, so that a total of four preprocessing amplifiers are required. However, according to an exemplary embodiment of the present invention, a total of two preprocessing amplifiers are used in the 2-bit flash ADC 310.

The number of preprocessing amplifiers is cut in half as mentioned above because the preprocessing amplifiers 311 included in the flash ADC 310 according to an exemplary embodiment of the present invention has a higher operating speed than the preprocessing amplifiers 111 included in the conventional flash ADCs 110a and 110b. This will be described in detail below.

Figure 5:
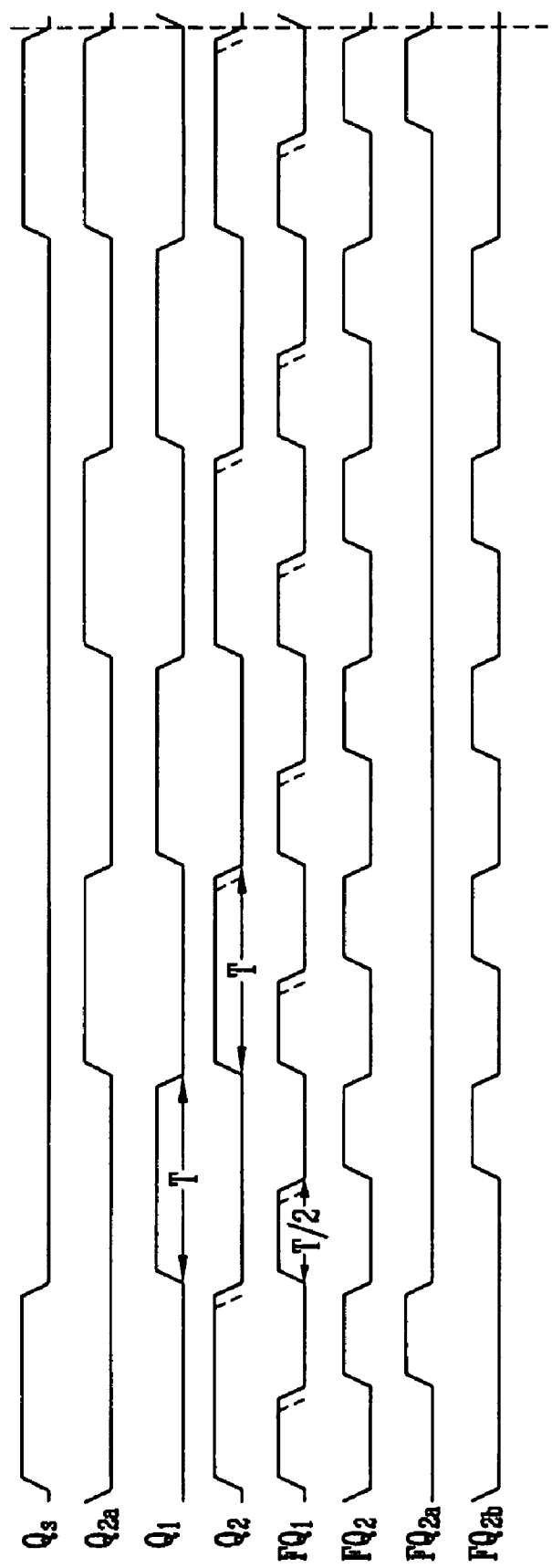
FIG. 5 is a waveform diagram for comparing operation of a flash ADC according to an exemplary embodiment of the present invention with that of a conventional flash ADC.

FIG. 5 is a waveform diagram for comparing operation of the flash ADC 310 according to an exemplary embodiment of the present invention with that of the conventional flash ADCs 110a and 110b.

Referring to FIG. 5, the preprocessing amplifiers 111 used in the conventional flash ADCs 110a and 110b amplifies and outputs differences between a reference voltage $V_{REF}$ and input voltages $V_{flash1}$ and $V_{flash2}$ input to the flash ADCs 110a and 110b according to phases $Q_1$ and $Q_2$ having a duty cycle of T.

On the other hand, the preprocessing amplifiers 311 used in the flash ADC 310 according to an exemplary embodiment of the present invention sample the reference voltage $V_{REF}$ according to a phase $FQ_1$ having a duty cycle of T/2, and amplify and output differences between the reference voltage $V_{REF}$ and input voltage $V_{flash}$ input to the flash ADC 310 according to phases $FQ_{2a}$ and $FQ_{2b}$.

Assuming that the operating speed of the preprocessing amplifiers 111 used in the conventional first and second flash ADCs 110a and 110b is a reference speed, it can be seen that the operating speed of the preprocessing amplifiers 311 used in the flash ADC 310 according to an exemplary embodiment of the present invention is double the reference speed.

In this way, the preprocessing amplifiers 311 are shared in the flash ADC 310 such that they can operate at double the reference speed. Thus, the number of the preprocessing amplifiers 311 used in the flash ADC 310 can be cut in half, thus enabling reduction of chip size.

(2) Dynamic Bandwidth Adjustment of the Operational Amplifier 340 Included in the MDAC 350

FIG. 6 is a diagram illustrating a dynamic bandwidth adjustment function of the operational amplifier 340 according to an exemplary embodiment of the present invention.

Referring to FIG. 6, the operational amplifier 340 according to an exemplary embodiment of the present invention includes first to third transistors M1 to M3. The first and second transistors M1 and M2 amplify and output residual voltage left after digitization by the flash ADC 310, and the third transistor M3 supplies a bias current $I_{Bias}$ to the first and second transistors M1 and M2. Here, a plurality of bleeding transistors $TR_1$ to $TR_6$ for adjusting the bias current $I_{Bias}$ are connected to the gate terminal of the third transistor M3.

When the bandwidth adjustment signals $BW_1$ to $BW_6$ are generated by the bandwidth adjustment signal generator 360, they are applied to the bleeding transistors $TR_1$ to $TR_6$ through switches, respectively. Then, currents $I_{unit(1)}$ to $I_{unit(6)}$ corresponding to the applied bandwidth adjustment signals $BW_1$ to $BW_6$ flow through the bleeding transistors $TR_1$ to $TR_6$, respectively. Thus, the bias current $I_{Bias}$ of the operational amplifier 340 equals the sum of the currents $I_{unit(1)}$ to $I_{unit(6)}$, i.e., $I_{Bias} = I_{unit(1)} + I_{unit(2)} + \ldots + I_{unit(6)}$.

Here, the duty cycles of the bandwidth adjustment signals $BW_1$ to $BW_6$ applied to the respective bleeding transistors $TR_1$ to $TR_6$ increase to N times that of a clock signal, in sequence according to arrangement order of the bleeding transistors $TR_1$ to $TR_6$, as illustrated in FIG. 6.

In this way, when the duty cycles of the bandwidth adjustment signals $BW_1$ to $BW_6$ applied to the respective bleeding transistors $TR_1$ to $TR_6$ increase in sequence according to arrangement order of the bleeding transistors $TR_1$ to $TR_6$, the currents $I_{unit(1)}$ to $I_{unit(6)}$ flowing through the bleeding transistors $TR_1$ to $TR_6$ also gradually increase.

Therefore, it is possible to control power consumption of the operational amplifier 340 to be nonlinear by differently adjusting the currents $I_{unit(1)}$ to $I_{unit(6)}$ flowing through the bleeding transistors $TR_1$ to $TR_6$. In result, stability is ensured when the MDAC 350 initially operates.

More specifically, every time the operational amplifier 340 according to an exemplary embodiment of the present invention operates, the bias current $I_{Bias}$ is adjusted according to the bandwidth adjustment signal $BW_i$, and thus the bandwidth of the operational amplifier 340 dynamically varies.

The reason that the bandwidth of the operational amplifier 340 is made to dynamically vary is as follows.

The algorithmic ADC 300 according to an exemplary embodiment of the present invention converts an analog signal into a digital signal by a specific number of bits, and thus a resolution required for each conversion step is reduced by the specific number of bits. Consequently, a required bandwidth of the operational amplifier 340 is also reduced by the specific number of bits.

In result, an exemplary embodiment of the present invention dynamically reduces the bandwidth of the operational amplifier 340 by adjusting the bias current $I_{Bias}$ of the operational amplifier 340 according to the bandwidth adjustment signal $BW_i$, thereby reducing power consumption.

Meanwhile, in an exemplary embodiment of the present invention, the duty cycles of the bandwidth adjustment signals $BW_1$ to $BW_6$ applied to the respective bleeding transistors $TR_1$ to $TR_6$ increase in sequence according to arrangement order of the bleeding transistors $TR_1$ to $TR_6$. On the contrary, however, it is also possible to reduce the duty cycles of the bandwidth adjustment signals $BW_1$ to $BW_6$ applied to the respective bleeding transistors $TR_1$ to $TR_6$ in sequence.

According to an exemplary embodiment of the present invention, the number of preprocessing amplifiers used in a flash ADC is reduced by sharing the preprocessing amplifiers in the flash ADC, and thus chip size of an algorithmic ADC can be reduced.

In addition, power consumption can be reduced by dynamically decreasing the bandwidth of an operational amplifier included in an MDAC according to a required resolution.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An algorithmic analog-to-digital converter (ADC), comprising:
   a flash ADC having shared preprocessing amplifiers, converting an analog input signal into a digital signal and outputting the digital signal;
   a multiplying digital-to-analog converter (MDAC) including first and second DACs, a subtractor, and an operational amplifier, converting residual voltage left after digitization by the flash ADC back into an analog signal and outputting the analog signal; and
   a bandwidth adjustment signal generator for generating bandwidth adjustment signals according to a required resolution and outputting the bandwidth adjustment signals to the operational amplifier of the MDAC,
   wherein bias current of the operational amplifier is adjusted according to the bandwidth adjustment signals, and a bandwidth of the operational amplifier dynamically varies.

2. The algorithmic ADC of claim 1, wherein when the flash ADC is an n-bit flash ADC, $2^n-1$ number of the preprocessing amplifiers are included in the n-bit flash ADC.

3. The algorithmic ADC of claim 2, wherein an operating speed of the preprocessing amplifiers included in the flash ADC is double a reference speed.

4. The algorithmic ADC of claim 1, wherein the operational amplifier includes:
   first and second transistors for amplifying and outputting the residual voltage left after digitization by the flash ADC; and
   a third transistor for supplying the bias current to the first and second transistors,
   wherein a plurality of bleeding transistors for adjusting the bias current supplied to the first and second transistors according to the bandwidth adjustment signals are connected to a gate electrode of the third transistor.

5. The algorithmic ADC of claim 4, wherein the bandwidth adjustment signals are applied to the bleeding transistors, respectively, and have different duty cycles.

6. The algorithmic ADC of claim 5, wherein the duty cycles of the bandwidth adjustment signals applied to the respective bleeding transistors increase to N times a duty cycle of a clock signal, in sequence according to arrangement order of the bleeding transistors.

7. The algorithmic ADC of claim 6, wherein currents corresponding to the bandwidth adjustment signals flow through the bleeding transistors.

8. The algorithmic ADC of claim 6, wherein the currents flowing through the bleeding transistors gradually increase or decrease depending on whether the duty cycles of the bandwidth adjustment signals applied to the bleeding transistors increase or decrease.

9. The algorithmic ADC of claim 1, further comprising:
   a digital correction circuit for correcting errors in the digital signal output from the flash ADC.

* * * * *